US008109768B2

(12) United States Patent
Nikaido et al.

(10) Patent No.: US 8,109,768 B2
(45) Date of Patent: Feb. 7, 2012

(54) CONNECTOR AND ELECTRONIC COMPONENT PROVIDED WITH SAME

(75) Inventors: Shinichi Nikaido, Sakura (JP); Haruo Miyazawa, Sakura (JP)

(73) Assignee: Fujikura Ltd., Tokyo (JP)

( * ) Notice: Subject to any disclaimer, the term of this patent is extended or adjusted under 35 U.S.C. 154(b) by 392 days.

(21) Appl. No.: 12/512,399

(22) Filed: Jul. 30, 2009

(65) Prior Publication Data

US 2010/0025096 A1 Feb. 4, 2010

(30) Foreign Application Priority Data

Aug. 1, 2008 (JP) ................................ 2008-199654

(51) Int. Cl.
*H05K 1/00* (2006.01)

(52) U.S. Cl. .......... 439/66; 174/262; 174/265; 439/709; 439/733.1; 439/86; 439/67

(58) Field of Classification Search .............. 439/65–68, 439/71, 73, 85, 86, 709, 733.1; 174/260–266
See application file for complete search history.

(56) References Cited

U.S. PATENT DOCUMENTS

| | | | | |
|---|---|---|---|---|
| 4,548,451 | A * | 10/1985 | Benarr et al. | 439/85 |
| 6,142,789 | A * | 11/2000 | Nolan et al. | 439/66 |
| 6,897,568 | B2 * | 5/2005 | Haimerl et al. | 257/779 |
| 6,939,143 | B2 * | 9/2005 | Rathburn | 439/66 |
| 7,354,277 | B2 * | 4/2008 | Hougham et al. | 439/66 |
| 7,549,870 | B2 * | 6/2009 | Mason et al. | 439/66 |
| 7,651,338 | B2 * | 1/2010 | Miyamoto et al. | 439/66 |
| 2003/0092293 | A1 | 5/2003 | Ohtsuki et al. | |
| 2004/0058580 | A1 | 3/2004 | Shirai et al. | |
| 2004/0266246 | A1 | 12/2004 | Hashimoto et al. | |
| 2008/0020624 | A1 * | 1/2008 | Nikaido et al. | 439/342 |
| 2008/0182436 | A1 * | 7/2008 | Rathburn | 439/78 |
| 2009/0050358 | A1 * | 2/2009 | Hilty et al. | 174/262 |

(Continued)

FOREIGN PATENT DOCUMENTS

JP 60-230377 A 11/1985

(Continued)

OTHER PUBLICATIONS

Japanese Office Acton dated Jan. 18, 2011, issued in corresponding Japanese Patent Application No. 2008-199654.

(Continued)

*Primary Examiner* — Hoa C Nguyen
(74) *Attorney, Agent, or Firm* — Westerman, Hattori, Daniels & Adrian, LLP

(57) ABSTRACT

A connector is provided that includes: a molded base part having a substrate and elastomers arranged on both sides of the substrate; a plurality of through holes in the molded base part, which pass through the molded base part in a stacked direction of the substrate and the elastomers, and are arranged in parallel at predetermined spacing; and L-shaped contacts arranged via the through holes from one surface side of the molded base part to another surface side, wherein: the elastomers incorporate a plurality of first protruding parts whose top faces are inclined, and second protruding parts that protrude from top faces of the first protruding parts in a dome shape; said contact has dome shaped convex parts whose insides are hollow, and said convex parts are formed at two ends of the contact, and the convex parts are arranged such that they cover the respective second protruding parts. Also provided is an electronic component provided with this connector.

4 Claims, 12 Drawing Sheets

U.S. PATENT DOCUMENTS

| | | | | |
|---|---|---|---|---|
| 2009/0075500 | A1 * | 3/2009 | Pennypacker et al. .......... | 439/69 |
| 2009/0197437 | A1 * | 8/2009 | Ouchi et al. .................... | 439/68 |

FOREIGN PATENT DOCUMENTS

| | | | |
|---|---|---|---|
| JP | 2001-332321 | A | 11/2001 |
| JP | 2004-71347 | A | 3/2004 |
| JP | 2004-158430 | A | 6/2004 |
| JP | 2005-19284 | A | 1/2005 |
| JP | 2006-525672 | A | 11/2006 |
| JP | 2008-166278 | A | 7/2008 |
| WO | 2004/093164 | A2 | 10/2004 |

OTHER PUBLICATIONS

Japanese Office Acrtion dated May 25, 2010, issued in corresponding Japanese Patent Application No. 2008-199654.

* cited by examiner

CONNECTOR AND ELECTRONIC COMPONENT PROVIDED WITH SAME

CROSS-REFERENCE TO RELATED APPLICATIONS

Priority is claimed on Japanese Patent Application No. 2008-199654, filed Aug. 1, 2008, the content of which is incorporated herein by reference.

BACKGROUND OF THE INVENTION

1. Field of the Invention

The present invention relates to a connector. In particular, it relates to a connector that can achieve fine pitches and low contact resistance with a simple construction, and an electronic component provided with this connector.

2. Description of Related Art

Heretofore, techniques have been investigated by which an IC package, such as a CPU, an LSI, or the like is mounted on a printed circuit board via a socket, and a socket for installing, a CPU, such as an LGA package, a BGA package, or the like, is mounted on many mother boards of personal computers and servers. There has been yearly progress in the number of pins and speed of CPUs owing to improvements in their functions and performance, and corresponding measures have been taken by increasing the size of the packages and making them more finely pitched. Accompanying this, sockets are required that can deal with the number of pins, and at the same time deal with the increase in the amount of bending accompanying the size increase of the packages, and that can deal with the dispersion of the heights of the contact loads and/or the solder balls of the packages. Therefore, it is important to make the size of the socket contacts small, and it is desirable to ensure that the contacts between the IC pins and the sockets have an appropriate contact pressure. Furthermore, it is important that the contacts have low inductance at high speeds, and it is required that the contact resistance is low, and the allowable current is high, corresponding to the increase in current consumption due to the high speeds.

Mainstream sockets for current LGA packages have 400 to 800 pins with a pitch of approximately 1 mm. For example, as described in Patent Document 1 and Patent Document 2, a construction is used that is manufactured by folding a metal plate in a complex way in order to form a predetermined contact shape, and inserting the contact in a socket housing.

Such a method is a system in which an appropriate load is generated at a predetermined stroke by making the metal contact function as a spring in order to obtain a stable contact resistance. Moreover, in the process for obtaining a predetermined contact pressure, when the load is increased, the contact location is shifted so that a wiping effect can be expected whereby oxide film and/or contamination on the surface can be removed.

However, fine pitches are difficult to be achieved using these methods. When trying to achieve a fine pitch, it is necessary to shorten the length of the cantilevered part of the spring of a contact terminal. However, if the length of the spring is shortened, in the case of a cantilever spring with the same material and the same shape, the load required to obtain a predetermined stroke increases. Therefore, if the wire diameter (width and/or thickness) of the cantilever spring is reduced in order to generate the appropriate load, the permissible stress is required to be low, so in spite of the original intention of moving it in the elastic deformation zone, it undergoes plastic deformation, making it impossible to withstand a predetermined load. This is because the permissible stress is proportional to the wire diameter (width and/or thickness) of the spring, while the spring constant, which is the main factor for determining the load, is proportional to fourth power of the wire diameter (width and/or thickness) of the cantilever spring.

Considering this, instead of the method of obtaining a predetermined contact pressure due to the load of a cantilever spring, a technique has been devised in which the metal of the contact part is designed in a region where it undergoes plastic deformation, and the repulsion force is compensated by rubber or an elastomer. For example, in Patent Document 3, the function of the contact part is realized by flexible printed circuit boards, and a construction is disclosed in which the elastomer is sandwiched between two flexible printed circuit boards, and the flexible printed circuit boards are joined by soldering metal pins provided separately in order to obtain top to bottom interlayer conduction.

In this technique, metal domes are formed at the parts in contact with the flexible printed circuit boards, and the metal domes make contact with the facing contact points. Furthermore, if the load is increased in a process for obtaining a predetermined contact pressure, the contact locations shift, so that a wiping effect for removing oxide film and/or contamination from the surface can be expected.

Moreover, in Patent Document 4, a method is disclosed in which metal plating is applied to an elastomer in which predetermined dome shapes and through holes have been formed in advance by a metal mold, and a circuit is formed using a photolithographic process such that contacts are connected by the through holes and the domes.

However, as disclosed in Patent Document 3, the method in which the flexible printed circuit board is sandwiched by an elastomer requires a process for manufacturing two flexible printed circuit boards on which circuits are formed in required patterns, and furthermore, it requires metal contacts for obtaining interlayer conduction to connect them. Therefore, the number of parts is large, which makes it difficult to achieve miniaturization. Moreover, since a process is required for connecting the flexible printed circuit boards and the metal pins, there is a problem in that the manufacturing method becomes complex. Furthermore, as disclosed in Patent Document 4, there are still many areas for development in techniques for plating on elastomers, and there is a problem in that mass-production techniques have not been established in general. Moreover, in Patent Document 4, since contact pressure is obtained by the dome parts being deformed, the contact locations do not change, so that there is also a problem in that a wiping effect cannot be expected.

[Patent Document 1] Japanese Unexamined Patent Application, First Publication No. 2004-158430
[Patent Document 2] Japanese Unexamined Patent Application, First Publication No. 2005-019284
[Patent Document 3] Japanese Unexamined Patent Application, First Publication No. 2004-071347
[Patent Document 4] Japanese Unexamined Patent Application, First Publication No. 2001-332321

BRIEF SUMMARY OF THE INVENTION

Problems to be Solved by the Invention

The present invention has been made in view of the above circumstances, and therefore has an object to provide a connector that can achieve fine pitches and a reduction in contact resistance with a simple construction, and an electronic component provided with the same.

Means for Solving the Problem (1) A connector of the present invention is characterized in that it is provided with: a molded base part having a substrate and elastomers arranged on both sides of the substrate; a plurality of through holes in the molded base part, which pass through the molded base part in a stacked direction of the substrate and the elastomers, and are arranged at predetermined spacing; and L-shaped contacts arranged via the through holes from one surface side of the molded base part to another surface side, wherein: the elastomers incorporate a plurality of first protruding parts whose top faces are inclined, and second protruding parts that protrude from top faces of the first protruding parts in a dome shape; said contact has dome shaped convex parts whose insides are hollow, and said convex parts are formed at two ends of the contact; and the convex parts are arranged such that they cover the respective second protruding parts.

(2) The connector of the present invention is characterized in that the first protruding parts, in (1), are arranged symmetrically about the substrate, and the second protruding parts are arranged symmetrically about the substrate.

(3) The connector of the present invention is characterized in that, in (1) or (2), the substrate is left exposed with no elastomers in the regions of the molded base part surrounding the through holes.

(4) An electronic component of the present invention is characterized in that it is provided with a connector according to any one of items (1) through to (3).

Effects of the Invention

According to the connector of the present invention, since it is possible to obtain predetermined load and displacement characteristics due to the elasticity of elastomers, the contacts are not required to have spring characteristics. Therefore it is possible to design without considering the permissible stress of the contacts, and hence a finer pitch is possible. Furthermore, in the connector of the present invention, when a load is applied to joining terminals of a semiconductor package or the like so that the convex parts of the contact make contact, the contact locations of the convex parts and the joining terminals shift during mounting. As a result, even in the case where oxide films, contamination, or the like are attached to the contact regions of the contacts and the joining terminals, it is possible to obtain contact on new areas by a wiping effect, so that the contact resistance can be reduced.

BRIEF DESCRIPTION OF THE REFERENCE SYMBOLS

Figure 1A:
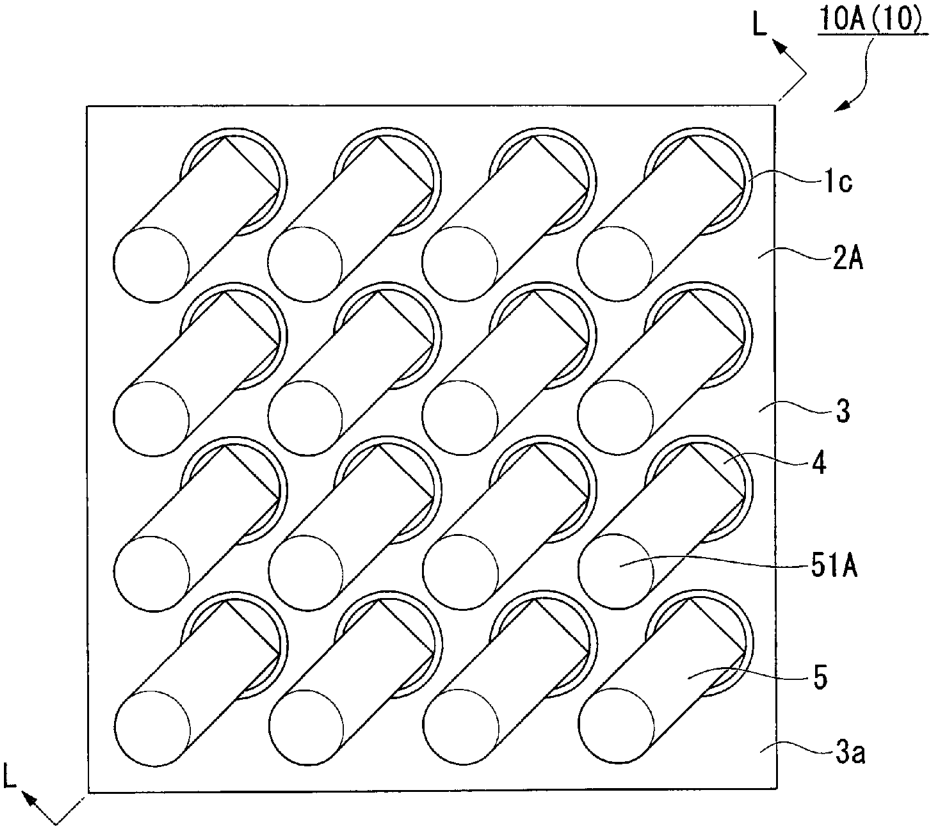
FIG. 1A is a plan view showing schematically, an example of a connector according to a first embodiment of the present invention.

1 Substrate
2 (2A, 2B) Elastomer
3 Molded base part
4 Through hole
5 Contact
10 (10A, 10B) Connector
21 (21A, 21B) First protruding part
21*s* Top face of first protruding part
22 (22A, 22B) Second protruding part
23 Burr
31 Metal mold
32 Cavity
33 Parting line
41 Punch
50 Hoop
51 (51A, 51B) Convex part of contact
60 Semiconductor package
61 Joining terminal
70 Circuit board
71 Joining terminal
80, 90 Electronic component
α Solderbump

DETAILED DESCRIPTION OF THE INVENTION

Hereunder is a detailed description of the present invention, with reference to the drawings. However, the present invention is not limited to this, and various modifications are possible provided they do not depart from the gist of the present invention.

First Embodiment

Figure 1B:
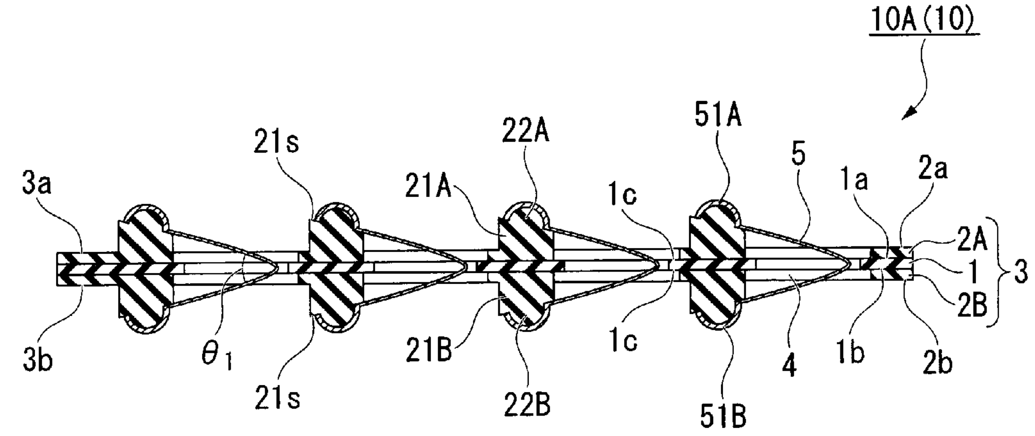
FIG. 1B is a diagram showing schematically, a sectional view through L-L of FIG. 1A.

FIG. 1A and FIG. 1B are diagrams showing schematically, a connector 10A according to a first embodiment of the present invention. FIG. 1A is a plan view, and FIG. 1B is a diagram showing schematically, a sectional view through L-L of FIG. 1A.

The connector 10A of the present invention comprises, in general: a molded base part 3 comprising a substrate 1 and elastomers 2 (2A, 2B) arranged on the two surfaces 1*a* and 1*b* of the substrate 1; a plurality of through holes 4 in the molded base part 3, which pass through the molded base part 3 in the stacked direction of the substrate 1 and the elastomers 2, and are arranged in parallel at predetermined spacing; and L-shaped contacts 5 arranged via the through holes 4 from one surface 3*a* of the molded base part 3 to the other surface 3*b*. Furthermore, a plurality of first protruding parts 21 (21A, 21B) whose top faces 21*s* are inclined, and second protruding parts 22 (22A, 22B), which protrude from the top faces 21*s* of the first protruding parts 21 in a dome shape, are arranged on the elastomers 2. Dome shaped convex parts 51 (51A, 51B) whose insides are hollow are formed at the two ends 5*a* and 5*b* (FIG. 2A, 2B) of the contacts 5, and the convex parts 51 are arranged such that they cover the respective second protruding parts 22. Hereunder is a detailed description of the connector 10A.

The substrate 1 is a insulator flat board, and the elastomers 2 (2A, 2B) are arranged on its two surfaces 1*a* and 1*b*, forming a molded base part 3. For the substrate 1, a flexible material, such as polyethylene terephthalate (PET), polyethylene naphthalate (PEN), polyether sulphone (PES), polyimide, polyamide imide, polyetherimide, or the like, and glass epoxy, liquid crystal polymer (LCP), or the like, can be given as examples. The thickness is greater than or equal to 25 μm and less than or equal to 2000 μm, for example.

For the elastomers 2 (2A, 2B), natural rubber, latex, isobutylene-isoprene rubber, silicone rubber, fluoride rubber, perfluoroether rubber, or the like can be given as examples. Appropriate choice is possible depending on the elasticity and characteristics required for a connector. That is, by adjusting the dimensions and the material of the elastomers 2, it is possible to control the load and displacement characteristics of the connector 10A of the present invention. By using the elastomers 2, there is no need for the contact 5 to have spring characteristics, so there is no limitation to the permissible stress of the contact 5, and it is possible to handle fine pitches.

The elastomers 2A arranged on the one surface 1*a* of the substrate 1 and the elastomers 2B arranged on the other surface 1*b* of the substrate 1 may be formed from the same type of material, or may be formed from different materials and have different elasticity.

Furthermore, on the one surface 1*a* and the other surface 1*b* of the substrate 1, there are no elastomers 2 arranged on the peripheries of the through holes 4, giving regions 1*c* where the substrate 1 is exposed. In this manner, by having the regions 1*c* where the substrate 1 is exposed, it is possible to achieve an improvement in the productivity of the manufacturing process as described later.

The first protruding parts 21 are formed from the same material as the elastomers 2, and are arranged on the two faces 2*a* and 2*b* of the elastomers 2 at predetermined spacing. The top faces 21*s* of the first protruding parts are sloped. The one end 5*a* and the other end 5*b* of each of the contacts 5 are placed along the slope. By the top faces 21*s* sloping, it is possible to gain height from the molded base part 3 to the top points of the second protruding parts 22, so that the operable stroke range when a load is applied to the contacts 5 can be designed to be wide. The angle of the slope and the direction of the slope of the top faces 21*s* may be the same for each of the first protruding parts 21, or may vary. Moreover, they may be the same on the one surface 1$a$ side and the other surface 2$b$ side of the substrate 1, or may be different. The angle of the slope and the direction of the slope can be adjusted appropriately depending on a conductive substrate connected electrically with the connector 10A of the present invention.

The heights of the first protruding parts 21 from the elastomers 2 may be the same for each of the first protruding parts 21, or may vary. Furthermore, they may be the same on the one surface 1$a$ side and the other surface 1$b$ side of the substrate 1, or may be different. The heights of each of the first protruding parts 21 can be adjusted appropriately according to the heights of the joining terminals of a conductive substrate connected electrically with the connector 10A of the present invention.

If the heights of each of the first protruding parts 21 are the same and the angles of the slopes of each of the top faces 21$s$ are the same, it is possible to control the predetermined load and displacement characteristics easily.

Figure 2A:
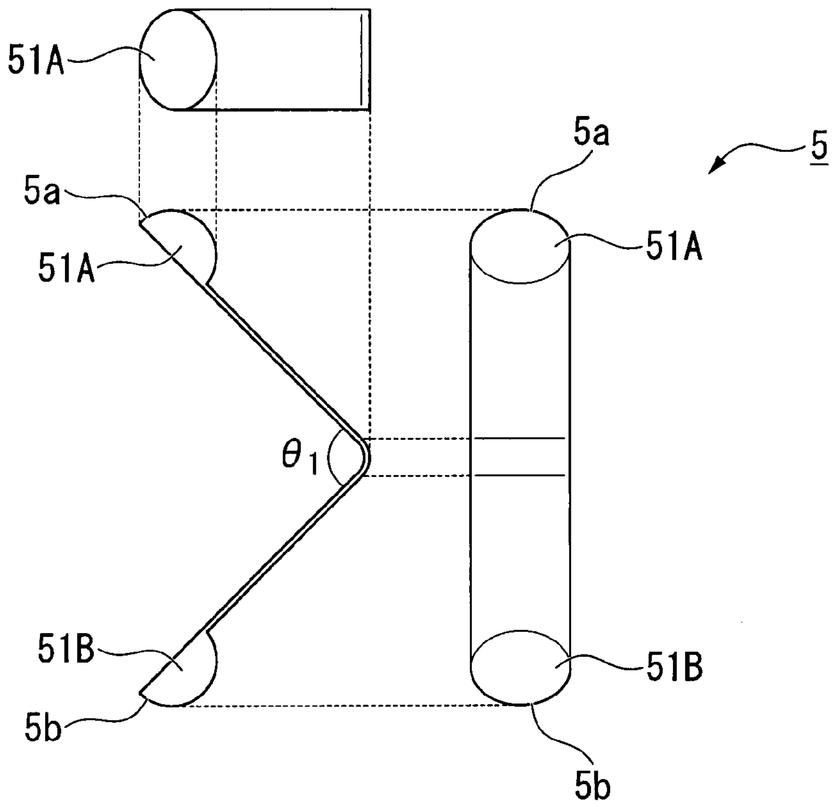
FIG. 2A contains a side view, a plan view and a rear view showing schematically, a contact used in the connector according to the first embodiment of the present invention.
Figure 2B:
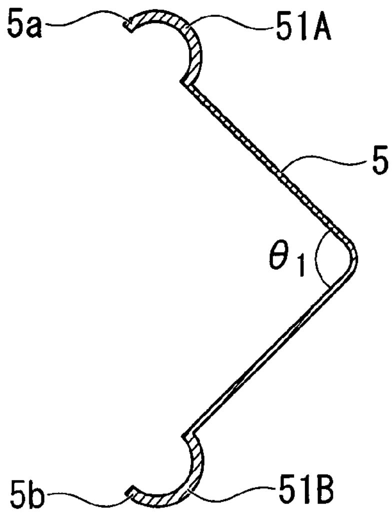
FIG. 2B is a cross-sectional view showing schematically, the contact used in the connector according to the first embodiment of the present invention.

The second protruding parts 22 (22A, 22B) are formed from the same material as the elastomers 2, are arranged on the top faces 21$s$ of the first protruding parts 21, and are dome shaped. Convex parts 51 (51A, 51B), which are hollow and dome shaped, are formed at the two ends 5$a$ and 5$b$ of the contact 5 (FIG. 2A, FIG. 2B). The surface of the second protruding part 22 is shaped such that it matches the convex part 51 of the contact 5. The size of the second protruding part 22 can be adjusted appropriately according to the pitch of the contact 5.

For the shape of the second protruding part 22, it may also be a round column, a polygonal column such as a triangular column or a quadrangular column, a cone, or a polygonal pyramid such as a triangular pyramid or a quadrangular pyramid.

It is preferable that the first protruding parts 21 are arranged symmetrically about the substrate 1 between the one surface 1$a$ side and the other surface 1$b$ side of the substrate 1. Furthermore, it is preferable that the second protruding parts 22 are arranged symmetrically about the substrate 1 between the one surface 1$a$ side and the other surface 1$b$ side of the substrate 1. By the first protruding parts 21 and the second protruding parts 22 being arranged symmetrically about the substrate 1, when the connector 10A of the present invention is connected to another conductive substrate or the like electrically with sufficient contact pressure, the contact pressure is applied to the same regions from the one surface 1$a$ side and the other surface 1$b$ side of the substrate 1. As a result, it is possible to prevent deformation of the substrate 1 occurring due to the stress caused by the contacts, as much as possible.

A plurality of through holes 4 is provided in the molded base part 3 at predetermined spacing, passing through the molded base part 3 in the thickness direction (stacked direction of the substrate 1 and the elastomers 2) of the molded base part 3. The size and shape of the through holes 4 is not specifically limited provided the contacts 5 can be inserted. Here, the predetermined spacing means greater than or equal to 0.3 mm and less than or equal to 2.5 mm, for example.

The contacts 5 are installed such that they are fed from the one surface 3$a$ to the other surface 3$b$ of the molded base part 3 via the through holes 4, and are designed for electrical conduction between the conductive substrate arranged on the one surface 3$a$ of the molded base part 3 and the conductive substrate arranged on the other surface 3$b$ of the molded base part 3. The contact 5 is L-shaped with the central part of the contact 5 bent at an angle of θ1 degrees as shown in FIG. 2A and FIG. 2B, and dome shaped convex parts 51 (51A, 51B) whose insides are hollow are formed on its two ends 5$a$ and 5$b$. FIG. 2A is a side view, a plan view, and a rear view of the contact 5, and FIG. 2B is a cross-sectional view.

For a material for forming the contact 5, copper, an alloy containing copper, or the like, are given as examples. The thickness may be such that it does not deform when mounted with a load applied to a semiconductor package or the like, and may be greater than or equal to 10 μm and less than or equal to 100 μm, for example. Moreover, the width of the contact 5 can be adjusted appropriately according to the conductivity or the like required for the connector, and may be greater than or equal to 100 μm and less than or equal to 1000 μm, for example. By using metal as the contact 5, it can be plated so that it is possible to reduce the contact resistance when it is electrically connected with the joining terminal of the conductive substrate. In particular, by performing plating using the same type of metal as the joining terminal, it is possible to further reduce the contact resistance.

In the construction of the present invention, in the case where copper is used as the contact 5, for example, if the thickness is greater than or equal to 20 μm, a design is possible whereby even if a load of 50 gf is applied, it is not deformed due to the elasticity of the rubber (elasticity of the elastomers 2, the first protruding part 21, and the second protruding part 22).

For example, in the case where contact points of 1 mm pitch are formed in the connector 10, a design is possible with the width of the contact 5 being 0.5 mm, and the radius of the dome of the convex part 51 being 0.25 mm. There is a tendency that, for the same contact thickness, the strength increases as the diameter of the dome reduces, so in the case of finer pitches, the thickness of the metal may be smaller. According to the present invention, it is possible to realize 0.3 mm pitch to 1.0 mm pitch.

According to the connector 10A of the present invention, there is no limitation to the permissible stress on the contact 5 itself, and even if the thickness and width are such that it undergoes plastic deformation, it is possible to obtain predetermined load and displacement characteristics due to the elasticity of the elastomers 2, the first protruding parts 21, and the second protruding parts 22. Fine pitches, such as 0.3 mm pitch to 1.0 mm pitch for example, are possible. Moreover, by selection of the dimensions and material of the elastomers 2, the first protruding parts 21, and the second protruding parts 22, it is possible to control the load of the connector 10A and the displacement characteristics. Furthermore, since the contacts 5 are made of metal, low contact resistance can be achieved by plating. Moreover, since the connector comprises the substrate 1, the elastomers 2, the first protruding parts 21, the second protruding parts 22, and the contacts 5, and since the elastomers 2, the first protruding parts 21, and the second protruding parts 22 can be molded collectively, it is possible to reduce the number of parts, enabling it to be miniaturized and to be manufactured easily, so that it is possible to reduce the cost and improve the yield.

<Manufacturing Method>

FIG. 3A to FIG. 3E and FIG. 4A to FIG. 4D are sectional views showing schematically, an example of a method of manufacturing the connector 10A of the present invention.

Figure 3A:
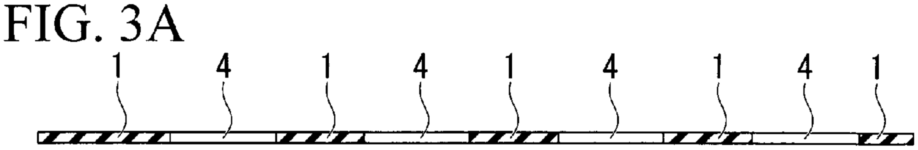
FIG. 3A is a sectional view showing schematically, a process for forming a plurality of through holes 4 in a substrate 1 in the connector according to the first embodiment of the present invention.

Firstly, as shown in FIG. 3A, a plurality of through holes 4 is formed in predetermined locations of the substrate 1 using machining or perforating by laser.

Figure 3B:
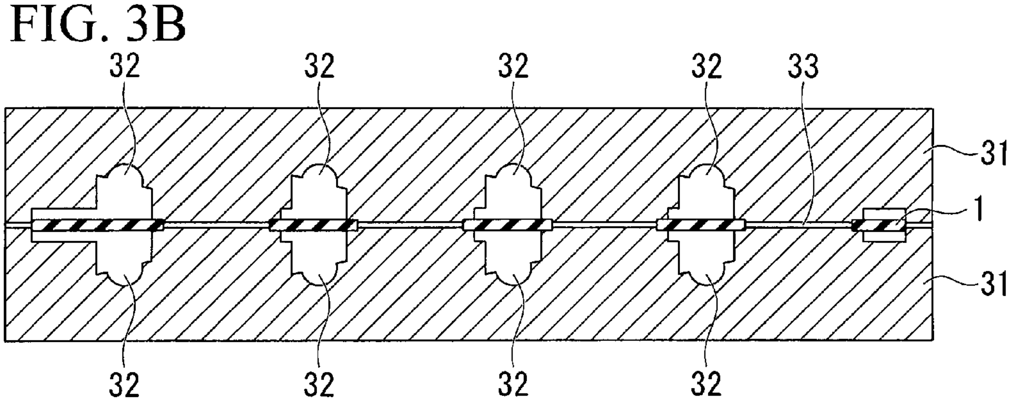
FIG. 3B is a sectional view showing schematically, a process for mounting a metal mold 31 on the substrate 1 in the connector according to the first embodiment of the present invention.
Figure 3C:
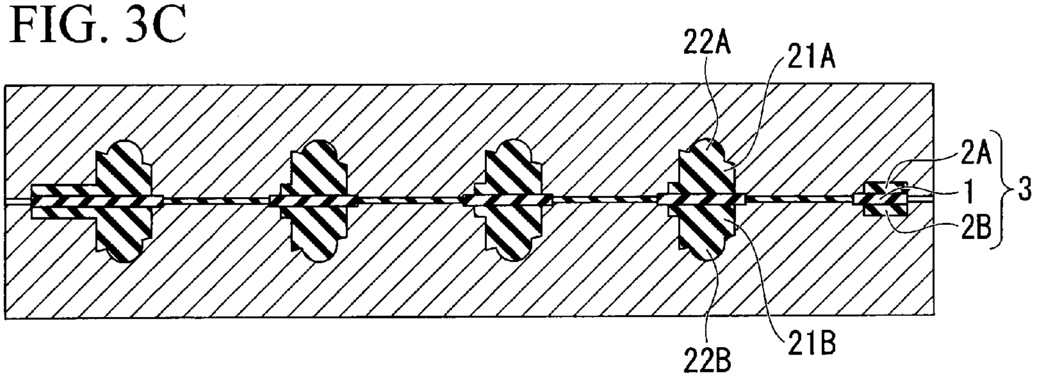
FIG. 3C is a sectional view showing schematically, a process for casting elastic material into cavities of the metal mold 31 in the connector according to the first embodiment of the present invention.

Next, as shown in FIG. 3B and FIG. 3C, the substrate 1 is mounted in a metal mold 31, elastic material of the elastomers 2, the first protruding part 21$s$, and the second protruding parts 22, is casted into the cavity 32 of the metal mold 31 by pouring or injection, and the metal mold 31 is heated up to vulcanizing temperature for molding. The metal mold 31 is not especially defined, so a conventionally known one can be used.

Since the elastomers 2, the first protruding parts 21, and the second protruding parts 22 are arranged on the substrate 1 by pouring or injection using the metal mold 31, the elastomers 2, the plurality of the first protruding parts 21 and the second protruding parts 22 can be formed on the two surfaces 1*a* and 1*b* of the substrate 1 collectively, so that it is possible to improve the work efficiency and the yield. Furthermore, since the elastomers 2 are arranged over the whole area of the one surface 1*a* of the substrate 1 excluding the peripheral parts 1*c* of the through holes 4, the first protruding parts 21 are not isolated on the substrate 1. Therefore, it is possible to provide a sprue hole (not shown in the figure) through which material is injected when forming the elastomers 2, in a free place of the metal mold 31.

Figure 3D:
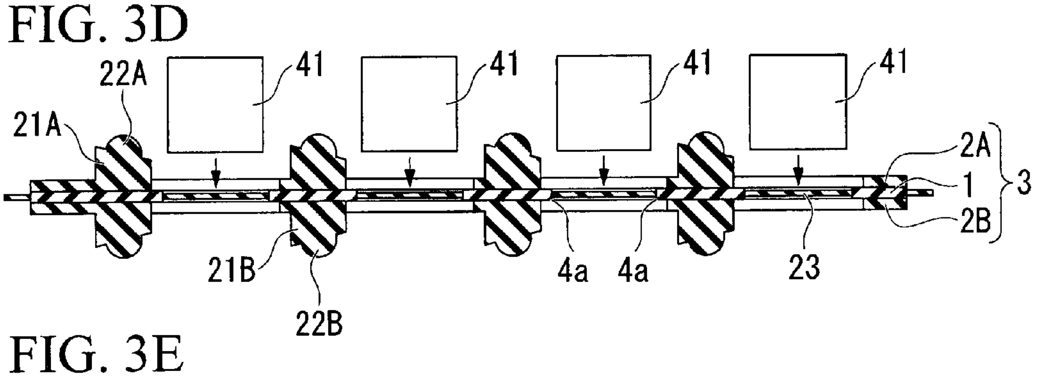
FIG. 3D is a sectional view showing schematically, a process for removing the metal mold 31 from the substrate 1 in the connector according to the first embodiment of the present invention.
Figure 3E:
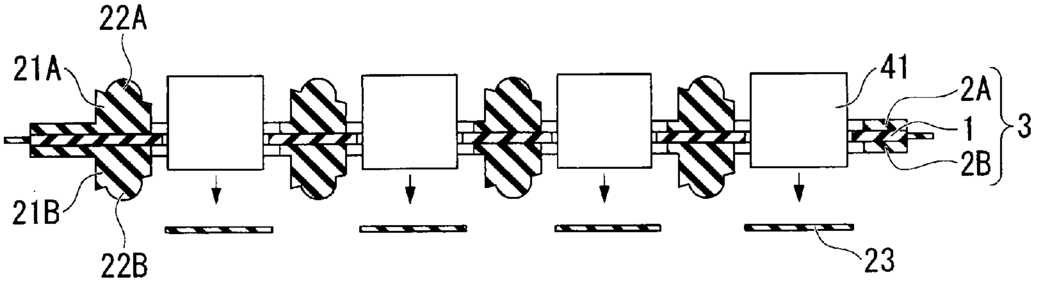
FIG. 3E is a sectional view showing schematically, a process for deburring elastomers 2 using a punch 41 in the connector according to the first embodiment of the present invention.

Next, as shown in FIG. 3D, the metal mold 31 is removed. In the case where burrs 23 occur in the through holes 4, the burrs of the elastomers 2 are removed by punches 41 or the like as shown in FIG. 3E.

At this time, as shown in FIG. 3B and FIG. 3C, it is preferable for the parting line 33 of the metal mold 31 to be set so as to give the thickness part of the substrate 1. Even in the case where burrs 23 occur as shown in FIG. 3D, the burrs 23 are not joined to the elastomers 2 formed on the substrate 1, and they make contact only with the inner wall surfaces 4*a* of the through holes 4 of the substrate 1, so that it is possible to remove just the burrs 23 easily.

Figure 4A:
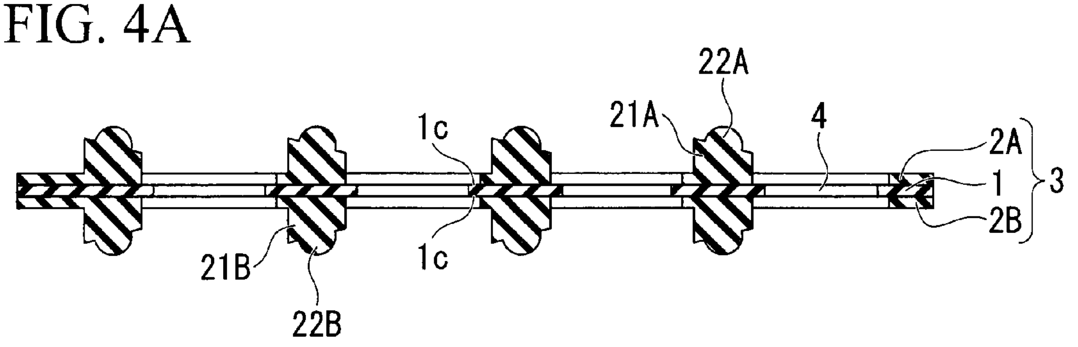
FIG. 4A is a sectional view showing schematically, a molded base part 3 in the connector according to the first embodiment of the present invention.
Figure 4B:
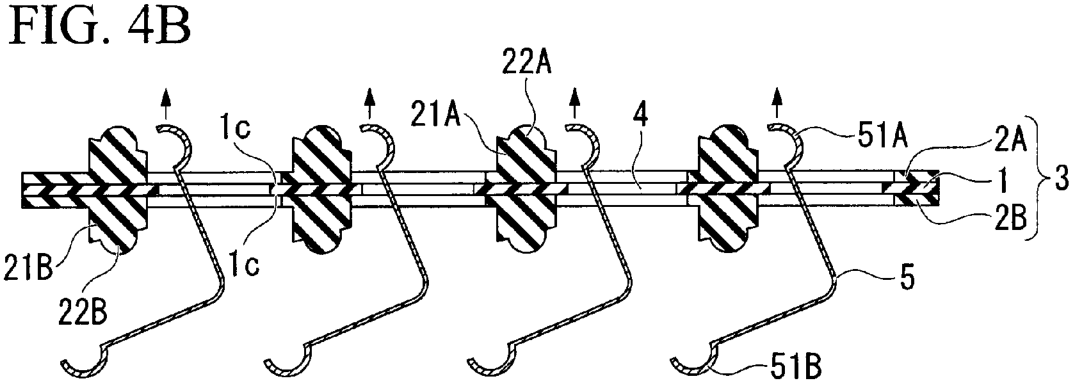
FIG. 4B is a sectional view showing schematically, a process for inserting contacts 5 into through holes 4 of the molded base part 3 in the connector according to the first embodiment of the present invention.

Next, as shown in FIG. 4A and FIG. 4B, the contacts 5 are inserted into the through holes 4 of the molded base part 3 manufactured in FIG. 3D.

Figure 5:
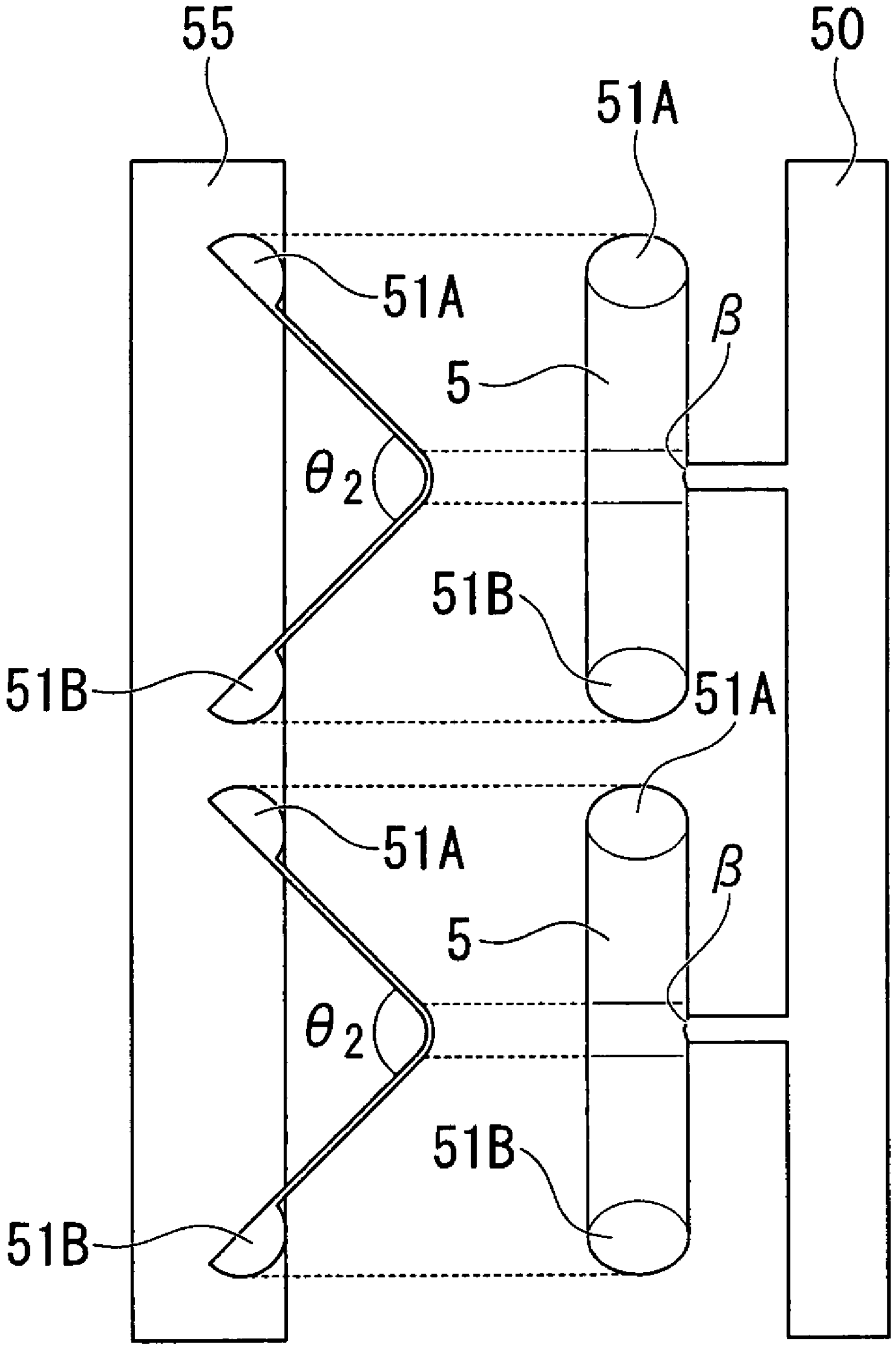
FIG. 5 is a diagram showing schematically, a method for manufacturing contacts in the connector according to the first embodiment of the present invention.

Regarding the manufacturing of the contacts 5, by press molding a metal plate in a series, it is possible to mold it in a hoop shape as shown in FIG. 5. If a process using a V groove β is applied at the breaks between the hoop 50 and the contacts 5, it is possible to separate each of the contacts 5 from the hoop 50 in an intended process easily.

Furthermore, conventionally, the surfaces of the parts (corresponding to the convex parts 51A and 51B) that make contact with the joining terminals of the conductive substrate are gold plated over a nickel-plated base. However, in the case of a hoop shape with such a configuration as shown in FIG. 5, it is possible to dip only the convex parts 51A and 51B and the two ends 5*a* and 5*b* of the contacts 5 in a plating bath 55. As a result, there is no need to plate unnecessary parts of the contacts 5, so that inexpensive nickel plating and gold plating are possible.

Regarding the contacts 5 manufactured in this manner, it is preferable that the L-shaped angle θ2 is made to be a shape opened sufficiently more widely than the angle θ1 of the final shape such that it is easy to insert the contacts 5 into the through holes 4 to mount the convex parts 51 on the second protruding parts 22.

Figure 4C:
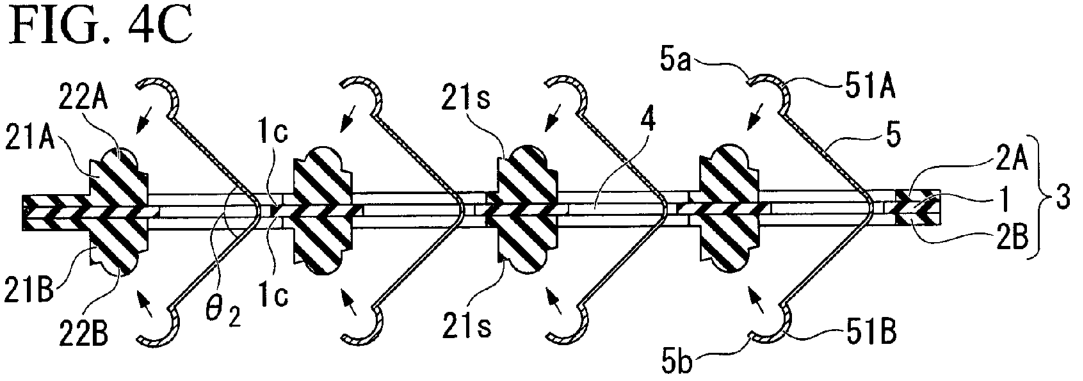
FIG. 4C is a sectional view showing schematically, a process for fitting the contacts 5 into the molded base part 3 in the connector according to the first embodiment of the present invention.

Next, as shown in FIG. 4C, the angles θ2 of the contacts 5 are reduced, and are bent such that the insides of the dome shaped convex parts 51A and 51B formed on the respective two ends 5*a* and 5*b* of the contacts 5 are fitted to the respective second protruding parts 22A and 22B.

Figure 4D:
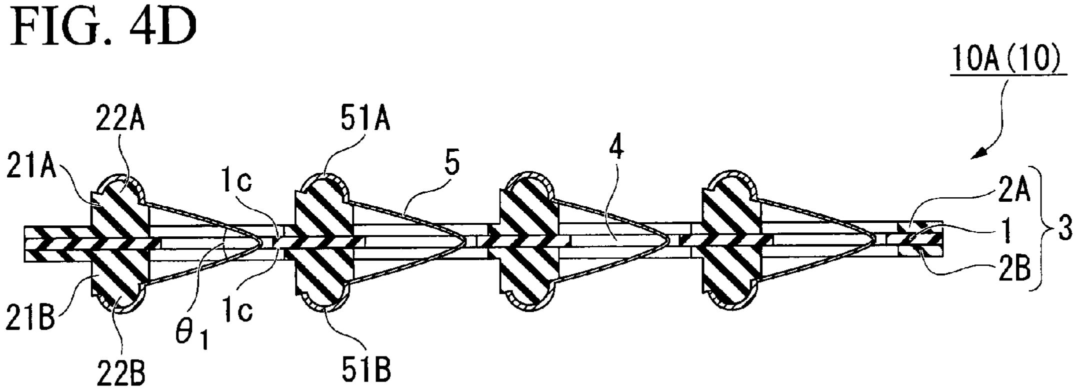
FIG. 4D is a sectional view showing schematically, an example of a process for manufacturing contacts in the connector according to the first embodiment of the present invention.

By the above, as shown in FIG. 4D, the connector 10A according to the first embodiment of the present invention can be obtained.

According to the method of manufacturing a connector 10A of the present invention, since the first protruding parts 21 and the second protruding parts 22 are not independent, but are connected to the elastomers 2, it is possible to form them together.

Therefore, the elastomers 2, the first protruding parts 21, and the second protruding parts 22 can be formed on the substrate 1 simultaneously, and hence the manufacturing process can be simplified. Furthermore, it is possible to fit the contacts 5 into the molded base part 3 easily.

<Electronic Component>

Figure 6A:
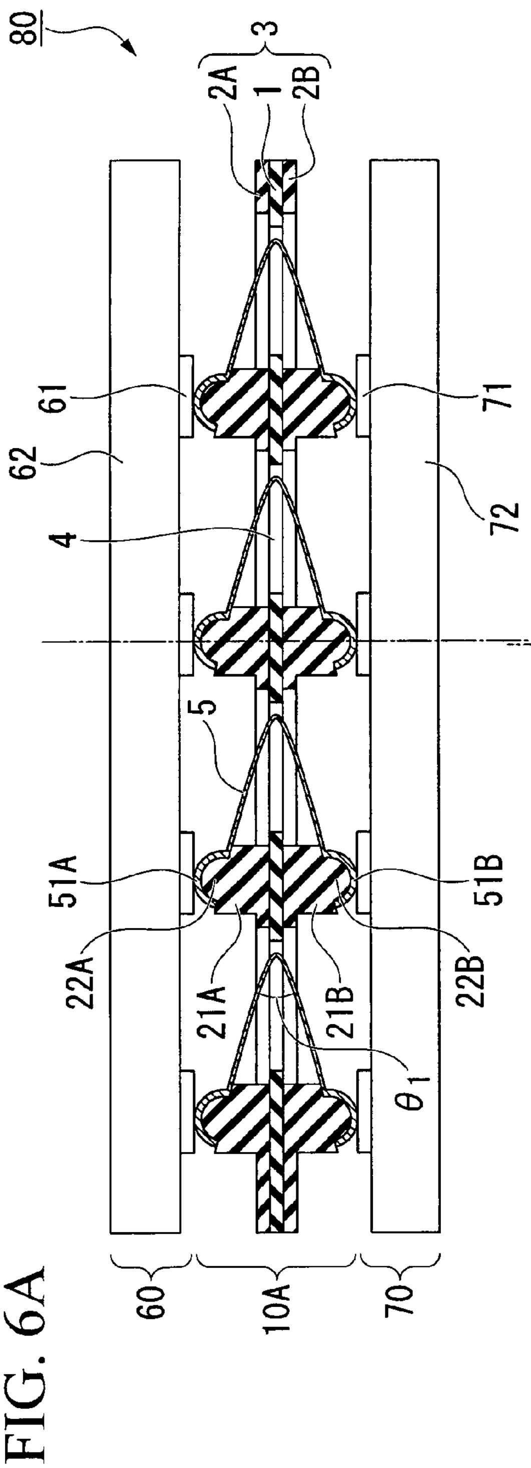
FIG. 6A is a sectional view showing schematically, an electronic component 80 in which a semiconductor package 60 and a circuit board 70 are connected electrically using the connector according to the first embodiment of the present invention.
Figure 6B:
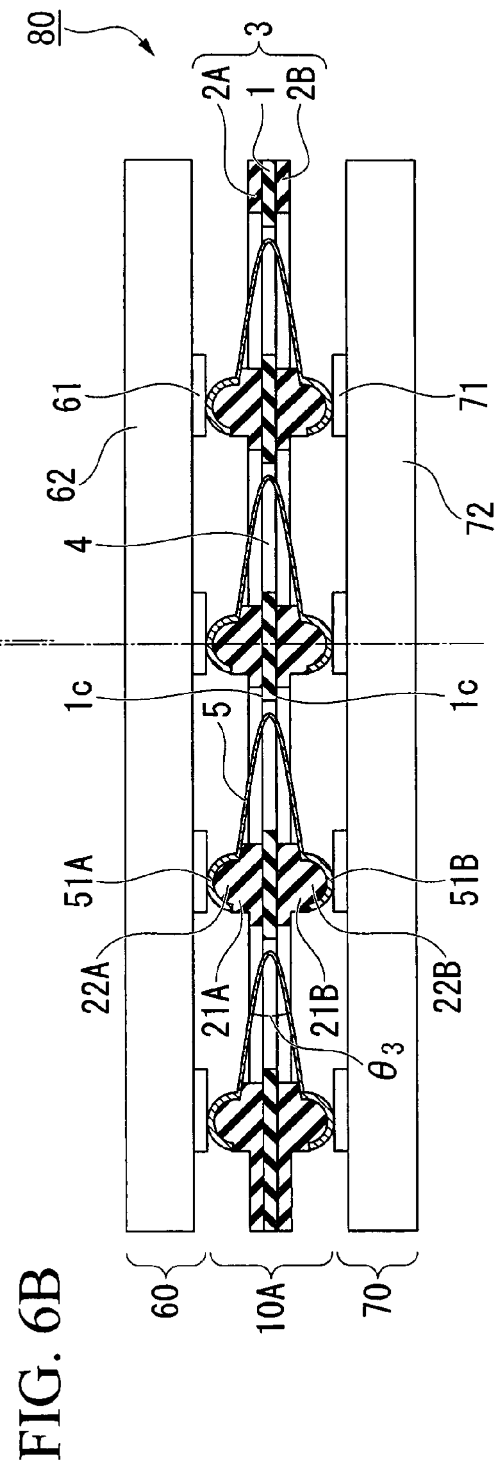
FIG. 6B is a sectional view showing schematically, a state in which a load is applied to the electronic component 80.

FIG. 6A and FIG. 6B are schematic diagrams of an electronic component 80 in which a semiconductor package 60 and a circuit board 70 are electrically connected, for example, using a connector 10A of the present embodiment. FIG. 6A shows a state in which the contacts 5 are connected with joining terminals 61 arranged on the semiconductor package 60 and joining terminals 71 arranged on the circuit board 70. FIG. 6B is a sectional view showing schematically, the state after a load is applied after the state of FIG. 6A.

The broken line in the drawing is a line passing through the contacts of the convex parts 51 of the contacts 5 and the joining terminals 61 and 71.

The semiconductor package 60 and the circuit board 70 are not especially defined, so commonly known ones can be used.

When the semiconductor package 60 and the circuit board 70 are connected electrically using the connector 10A of the present embodiment, the elastomers 2 undergoes elastic deformation, so the angle θ1 of the contacts 5 becomes θ3, which is a smaller angle. At this time, it is possible for the connector 10A, the semiconductor package 60, and the circuit board 70 to be mounted by appropriate contact pressure due to the stress created by elastic deformation. Moreover, as shown in FIG. 6A and FIG. 6B, the contacts of the contacts 5 and the joining terminals 61 shift when load is applied. Therefore, even in the case where foreign substances, oxide films, or the like are attached to the contact surfaces of the joining terminals 61 and 71 and the contacts 5, it is possible to obtain contact on new areas in the contact regions of both of the joining terminals 61 of the semiconductor package 60 and the joining terminals 71 of the circuit board 70 by a wiping effect, so that the resistance can be reduced.

Second Embodiment

Figure 7A:
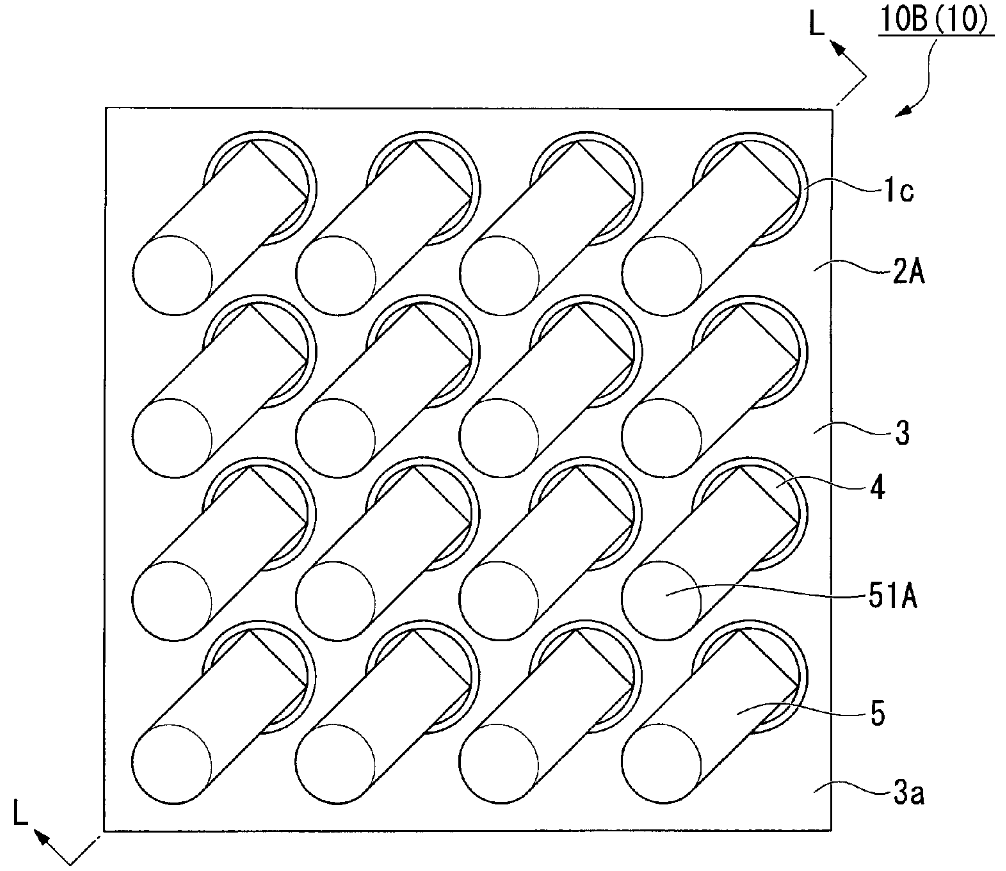
FIG. 7A is a plan view showing schematically, an example of a connector according to a second embodiment of the present invention.
Figure 7B:
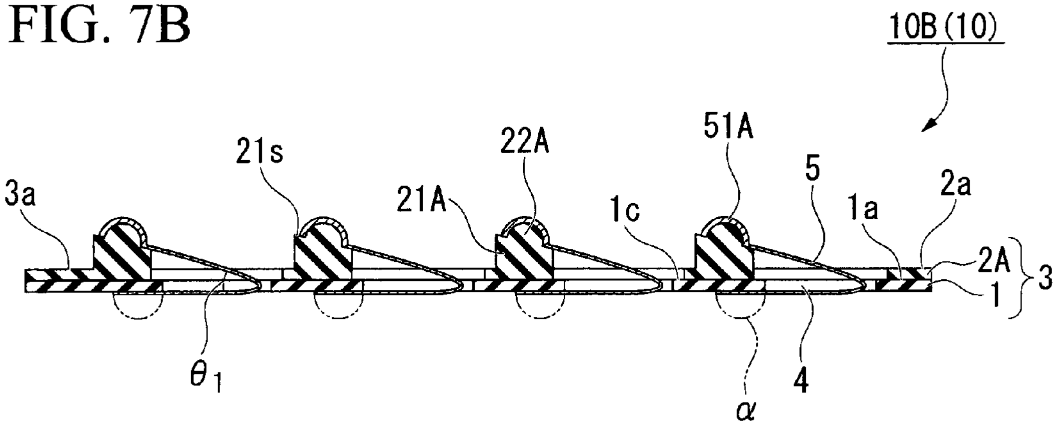
FIG. 7B is a sectional view through L-L of FIG. 7A.

FIG. 7A and FIG. 7B show, schematically, a connector 10B according to a second embodiment of the present invention.

FIG. 7A is a plan view, and FIG. 7B is a sectional view through L-L of FIG. 7A. The same reference symbols are used as for the same elements of the first embodiment, and the descriptions are sometimes omitted.

Figure 8A:
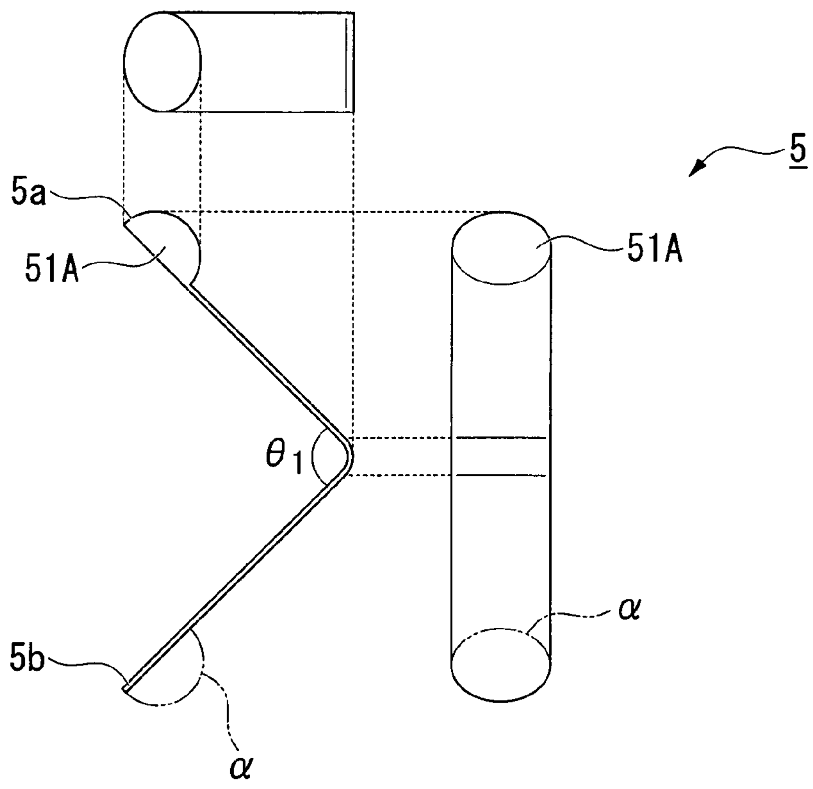
FIG. 8A contains a side view, a plan view, and a rear view, showing schematically, a contact used in the connector according to the second embodiment of the present invention.
Figure 8B:
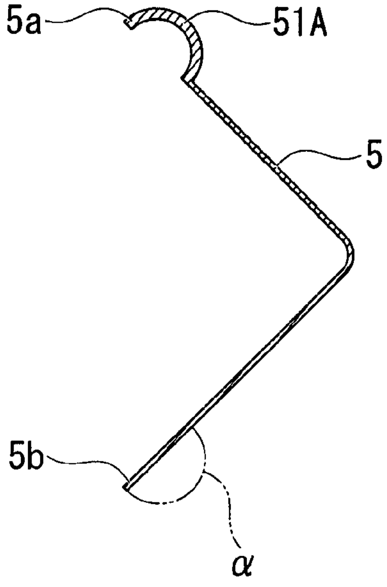
FIG. 8B is a cross-sectional view showing schematically, the contact used in the connector according to the second embodiment of the present invention.

The point of difference between the connector 10B of the present embodiment and the connector 10A of the first embodiment is that the first protruding parts 21A, the second protruding parts 22A, and the elastomers 2 are arranged on only the one surface 1*a* of the substrate 1. In this manner, in the present invention, the elastomers 2, the first protruding parts 21, and the second protruding parts 22 may be arranged on only the one surface 1*a* of the substrate 1 according to the electronic component, or the like, that is employed. At this time, as shown in FIG. 8A and FIG. 8B, a solder bump α is provided on the other end 5*b* of the contact 5, and the contact 5 is connected to another conductive substrate or the like electrically via the solder bump α.

According to the connector 10B of the present embodiment, when contact is made with another conductive substrate on the one surface 1*a* of the substrate 1, the stroke amount can be adjusted, so that it is possible to mount it with an appropriate contact pressure. Furthermore, it is possible to make it smaller than the connector 10A of the first embodiment.

<Manufacturing Method>

FIG. 9A to FIG. 9E and FIG. 10A to FIG. 10D are sectional views showing schematically, an example of a method for manufacturing the connector 10B according to the present embodiment.

Figure 9A:
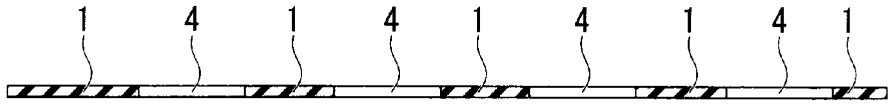
FIG. 9A is a sectional view showing schematically, a process for forming a plurality of through holes 4 in a substrate 1 in the connector according to the second embodiment of the present invention.

Firstly, as shown in FIG. 9A, similarly to the connector 10A of the first embodiment, through holes 4 are formed at predetermined spacing.

Figure 9B:
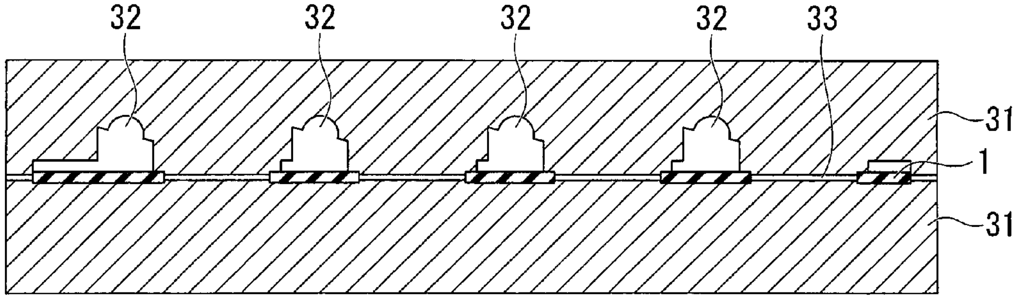
FIG. 9B is a sectional view showing schematically, a process for mounting a metal mold 31 on the substrate 1 in the connector according to the second embodiment of the present invention.
Figure 9C:
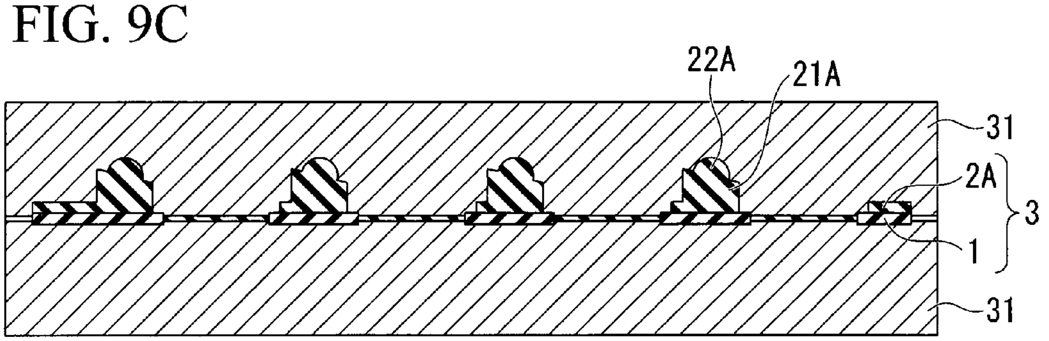
FIG. 9C is a sectional view showing schematically, a process for casting elastic material into cavities of the metal mold 31 in the connector according to the second embodiment of the present invention.

Next, as shown in FIG. 9B and FIG. 9C, the substrate 1 is mounted in a metal mold 31, elastic material of the elastomers 2 is casted into the cavity 32 of the metal mold 31 by pouring or injection, and the metal mold 31 is heated up to vulcanizing temperature for molding. The metal mold 31 is not especially defined, so a conventionally known one can be used.

Since the elastomers 2, the first protruding parts 21, and the second protruding parts 22 are arranged on the one surface 1*a* of the substrate 1 by pouring or injection using the metal mold 31, the plurality of first protruding parts 21 and second protruding parts 22, which are formed on the elastomers 2 can be formed on the one surface 1*a* of the substrate 1 collectively, so that it is possible to improve the work efficiency and the yield. Furthermore, since the elastomers 2 are arranged on the whole area of the one surface 1*a* of the substrate 1 excluding the peripheral parts 1*c* of the through holes 4, the first protruding parts 21 are not isolated on the substrate 1. Therefore, it is possible to provide a sprue hole (not shown in the figure) through which material is injected when forming the elastomers 2, in a free place of the metal mold 31.

Figure 9D:
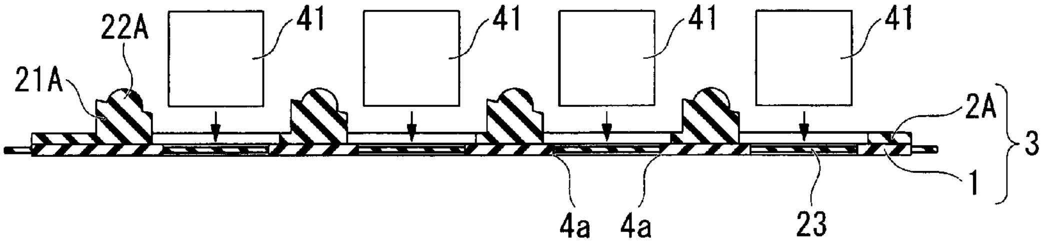
FIG. 9D is a sectional view showing schematically, a process for removing the metal 31 from the substrate 1 in the connector according to the second embodiment of the present invention.
Figure 9E:
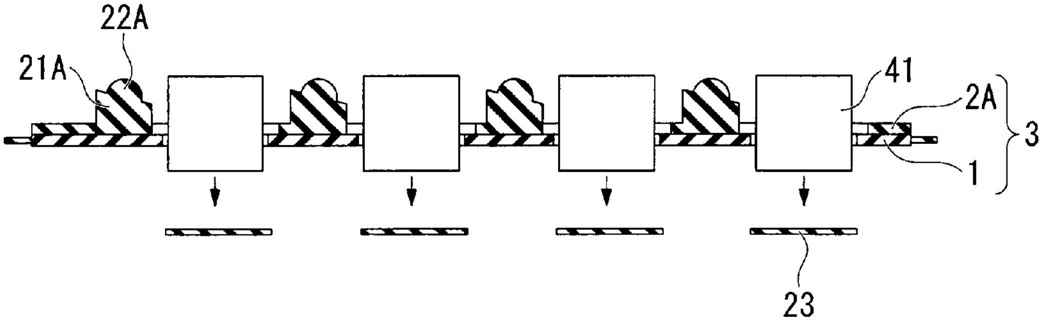
FIG. 9E is a sectional view showing schematically, a process for deburring elastomers 2 using a punch 41 in the connector according to the second embodiment of the present invention.

Next, as shown in FIG. 9D, the metal mold 31 is removed. In the case where burrs 23 occur in the through holes 4, the burrs of the elastomers 2 are removed by punches 41 or the like as shown in FIG. 9E.

At this time, it is preferable for the parting line 33 of the metal mold 31 to be set so as to give the thickness part of the substrate 1. Even in the case where burrs 23 occur as shown in FIG. 9D, the burrs 23 are not joined to the elastomers 2 on the substrate 1, and they make contact with the inner wall surfaces 4*a* of the through holes 4 formed in the substrate 1, so that it is possible to remove them easily.

Next, as shown in FIG. 10A to FIG. 10E, the contacts 5 are inserted into the through holes 4 of the molded base part 3 manufactured in FIG. 9D.

Figure 11:
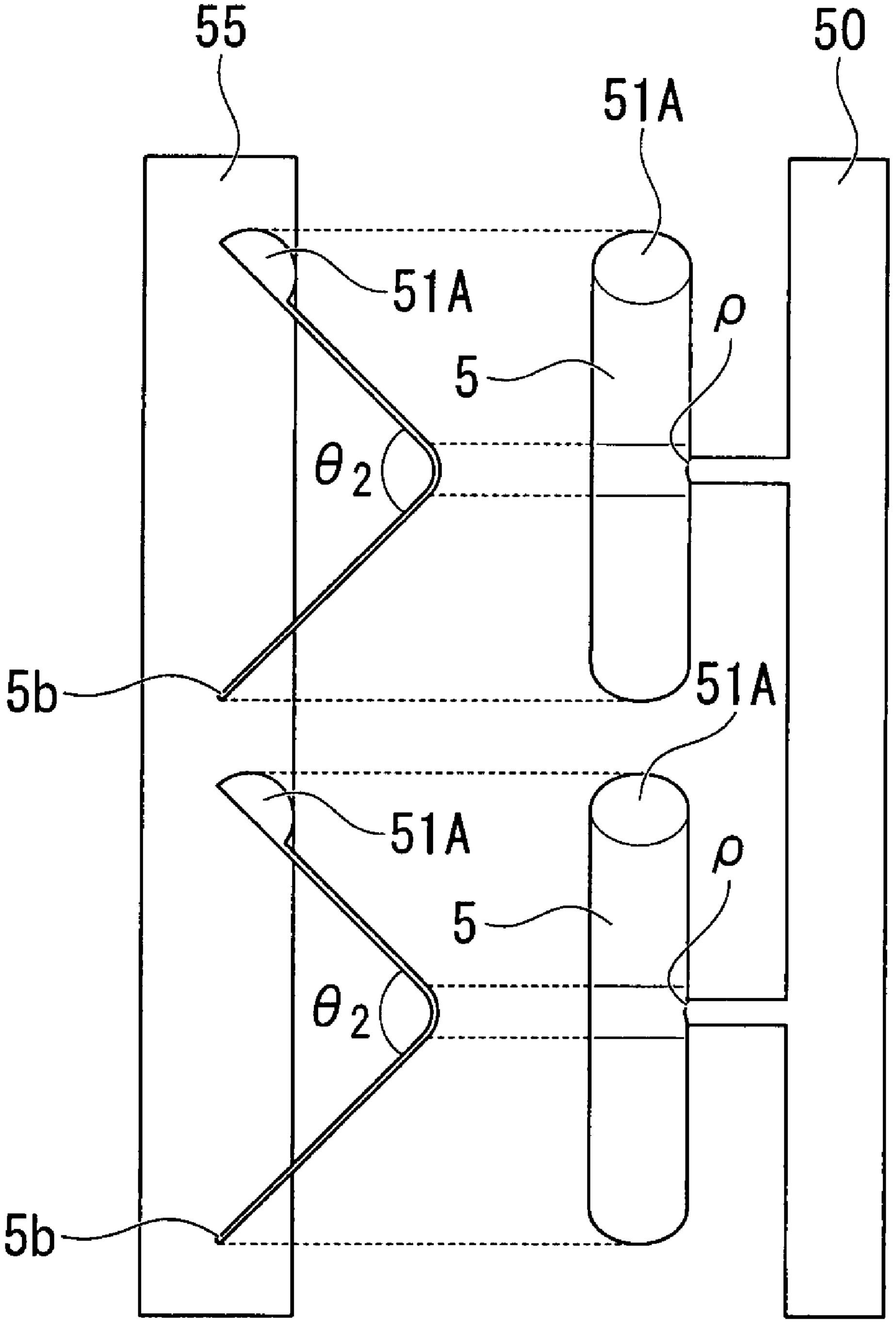
FIG. 11 is a diagram showing schematically, a method for manufacturing contacts in the connector according to the second embodiment of the present invention.

Regarding the manufacturing of the contacts 5, by press molding a metal plate in a series, it is possible to mold it in a hoop shape as shown in FIG. 11. If a process using a V groove ρ is applied at the breaks between a hoop 50 and the contacts 5, it is possible to separate each of the contacts 5 from the hoop 50 in an intended process.

Furthermore, conventionally, the surfaces of the parts that make contact with the joining terminals of the conductive substrate are gold plated over a nickel base. However, in the case of a hoop shape with such a configuration as shown in FIG. 11, it is possible to dip only the dome shaped convex parts 51A and the other ends 5*b* of the contacts 5 in a plating bath 55. As a result, there is no need to plate unnecessary parts, so that inexpensive nickel plating and gold plating are possible.

Regarding the contacts 5 manufactured in this manner, it is preferable that the L-shaped angle θ2 is made to be a shape opened sufficiently more widely than the angle θ1 of the final shape such that it is easy to insert the contacts 5 into the through holes 4 to mount the convex parts 51A on the second protruding parts 22A.

Figure 10A:
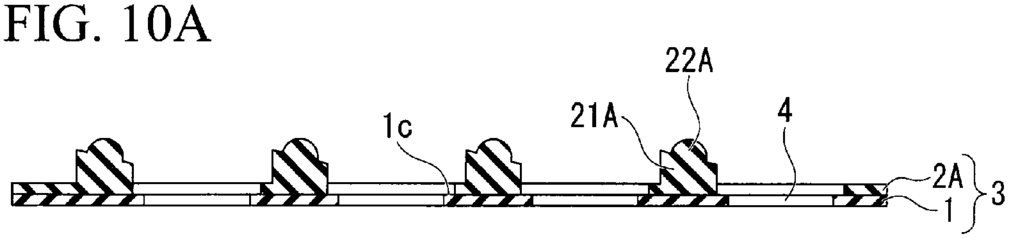
FIG. 10A is a sectional view showing schematically, a molded base part 3 in the connector according to the second embodiment of the present invention.
Figure 10B:
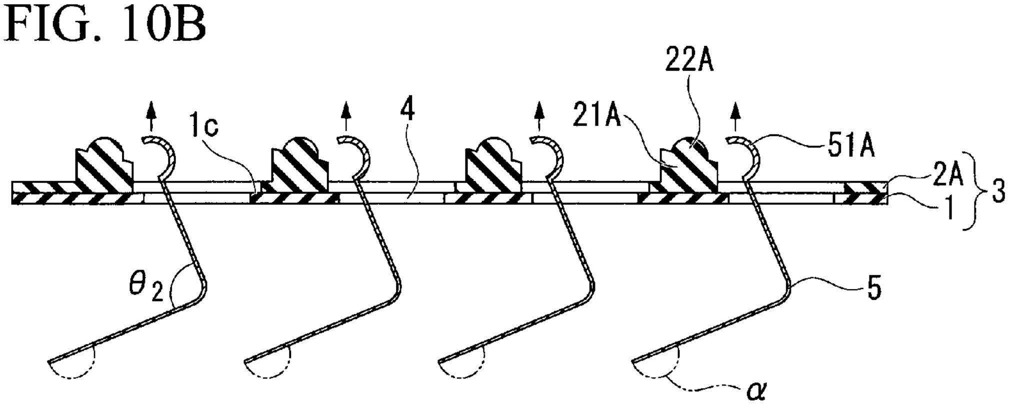
FIG. 10B is a sectional view showing schematically, a process for inserting contacts 5 into through holes 4 of the molded base part 3 in the connector according to the second embodiment of the present invention.
Figure 10C:
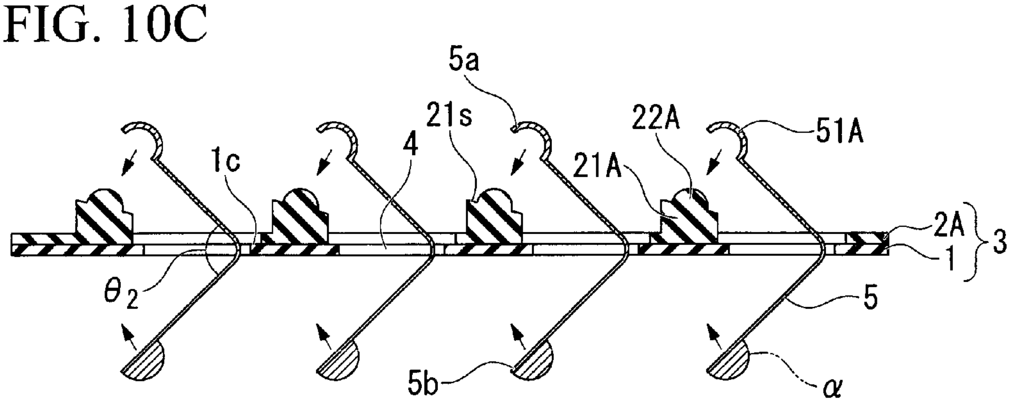
FIG. 10C is a sectional view showing schematically, a process for fitting the contacts 5 into the molded base part 3 in the connector according to the second embodiment of the present invention.

Next, as shown in FIG. 10C, the angles θ2 of the contacts 5 are reduced, and are bent such that the insides of the dome shaped convex parts 51A arranged on the one end 5*a* of each of the contacts 5 are fitted to the second protruding parts 22A.

Figure 10D:
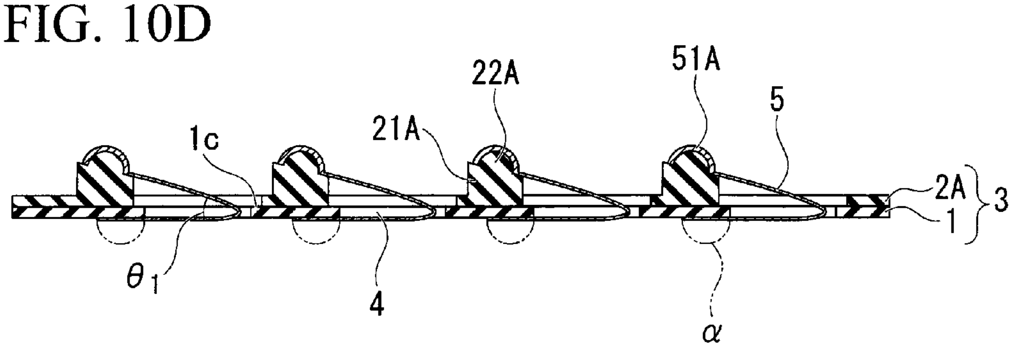
FIG. 10D is a sectional view showing schematically, an example of a process for manufacturing contacts in the connector according to the second embodiment of the present invention.

By the above, as shown in FIG. 10D, the connector 10B according to the second embodiment of the present invention can be obtained.

According to the method of manufacturing a connector 10B of the present invention, the elastomers 2, the first protruding parts 21A, and the second protruding parts 22A can be formed on the one surface 1*a* of the substrate 1 together, and hence the manufacturing process can be simplified. Furthermore, it is possible to fit the contacts 5 into the molded base part 3 easily.

<Electronic Component>

Figure 12A:
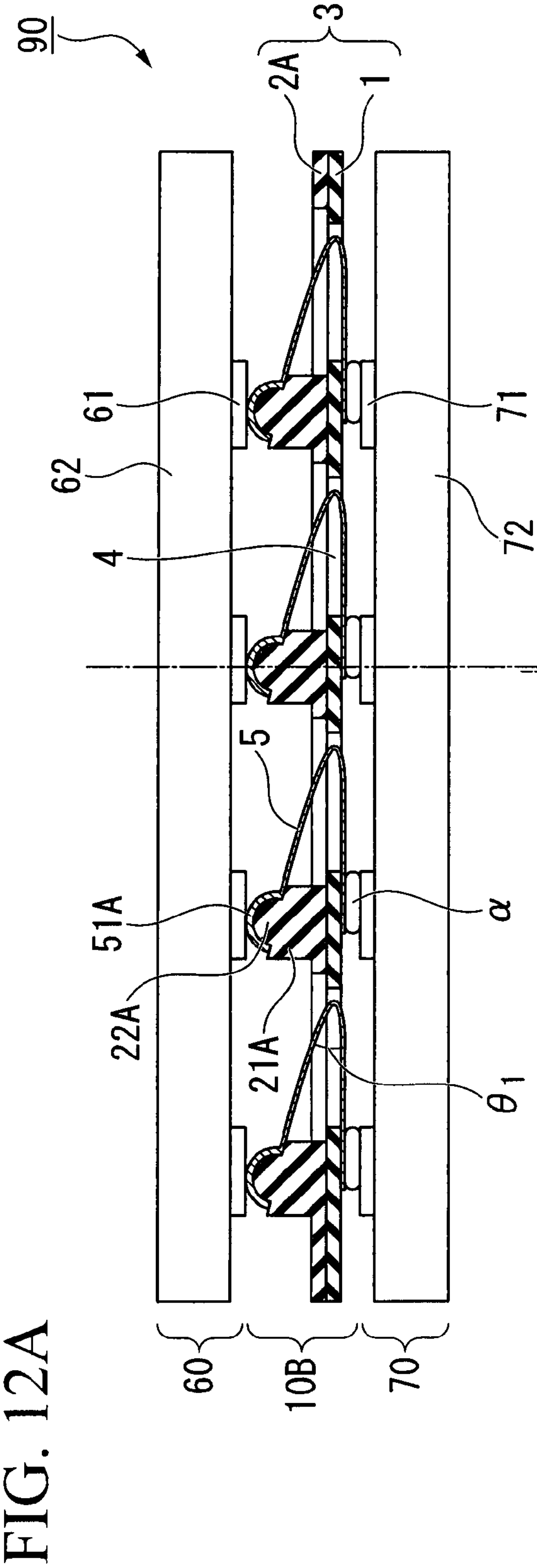
FIG. 12A is a sectional view showing schematically, an electronic component 90 in which a semiconductor 60 and a circuit board 70 are connected electronically using the connector according to the second embodiment of the present invention.
Figure 12B:
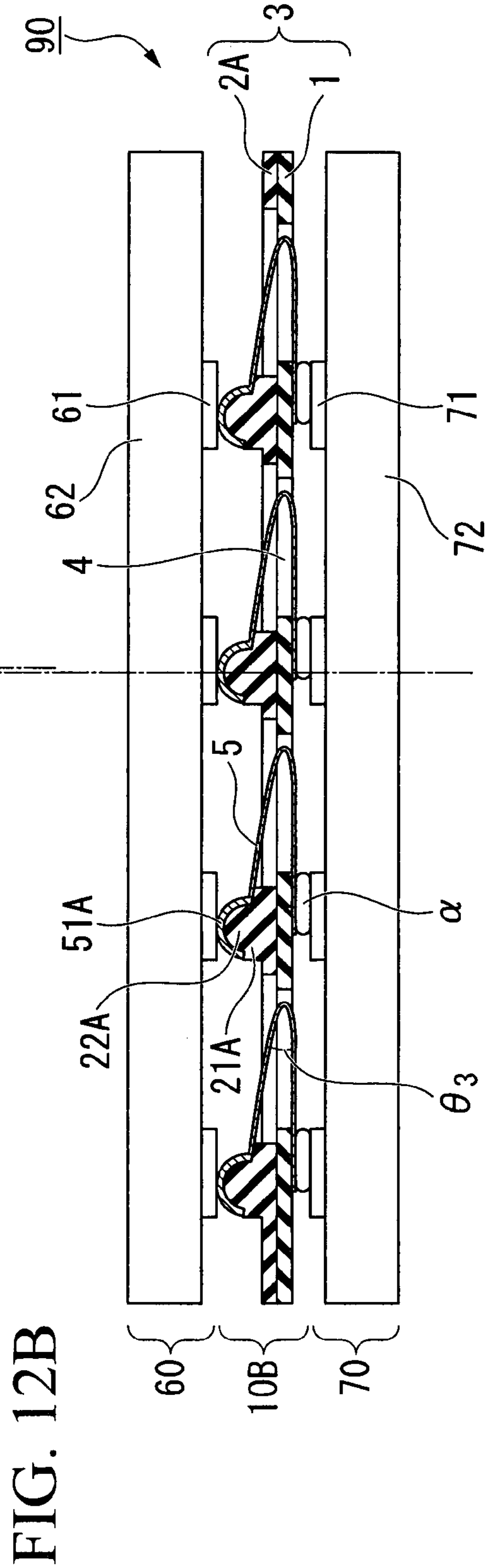
FIG. 12B is a sectional view showing schematically, a state in which a load is applied to the electronic component 90.

FIG. 12A and FIG. 12B are diagrams showing schematically, an example of an electronic component 90 in which a semiconductor package 60 and a circuit board 70 are electrically connected, for example, using a connector 10B of the present embodiment. FIG. 12A shows a state in which the contacts 5, and joining terminals 61 provided on the semiconductor package 60, and joining terminals 71 arranged on the circuit board 70 are connected. FIG. 12B is a sectional view showing schematically, the state after a load is applied after the state of FIG. 12A. The connector 10B and the circuit board 70 are connected electrically via the solder bumps α arranged on the other ends 5*b* of the contacts 5. After the connector 10B is mounted on the circuit board 70 and the solder bumps α are reflowed, it can be connected electrically with the semiconductor package 60 by applying a load.

By applying a load, the elastomers 2 undergo elastic deformation, and the angle θ1 of the contacts 5 becomes θ3, which is a smaller angle. At this time, it is possible for the connector 10B and the semiconductor package to be mounted by appropriate contact pressure due to the stress created by elastic deformation. Moreover, the broken line in the drawing is a line passing through the contacts between the convex parts 51 of the contacts 5 and the joining terminals 61, and the contacts between the solder bumps α of the contacts 5 and the joining terminals 71. However, by applying the load, the contacts have shifted. Therefore, even in the case where contamination, oxide films, or the like are attached to the contact surfaces of the joining terminals 61 and the contacts 5, it is possible to obtain contacts on new areas in the contact regions of the semiconductor package 60 and the joining terminals 61 by a wiping effect, so that the resistance can be reduced. Furthermore, since the elastomers 2, the first protruding parts 21, and the second protruding parts 22 are arranged on only the one surface 1*a* of the substrate 1, it is possible to achieve greater miniaturization of the electronic component 90 using the connector 10B of the second embodiment, than the electronic component 80 using the connector 10A of the first embodiment.

INDUSTRIAL APPLICABILITY

It is possible to use a connector of the present invention for an IC socket used when mounting an IC package such as a CPU, LSI, or the like on a printed circuit board, and to achieve fine pitches and a reduction in contact resistance, which is useful for industry.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A connector comprising:

a molded base part having a substrate and elastomers arranged on both sides of the substrate;

a plurality of through holes in said molded base part, which pass through said molded base part in a stacked direction of said substrate and said elastomers, and are arranged at predetermined spacing; and L-shaped contacts arranged via said through holes from one surface side of the molded base part to another surface side, wherein:

said elastomers incorporate a plurality of first protruding parts whose top faces are inclined, and second protruding parts that protrude from top faces of said first protruding parts in a dome shape;

said contact has dome shaped convex parts whose insides are hollow, and said convex parts are formed at two ends of said contact; and said convex parts are arranged such that they cover the respective second protruding parts.

2. The connector according to claim 1, wherein said first protruding parts are arranged symmetrically about said substrate, and said second protruding parts are arranged symmetrically about said substrate.

3. The connector according to claim 1, wherein said substrate is left exposed with no elastomers in the regions of said molded base part surrounding said through holes.

4. An electronic component provided with a connector according to any one of claim 1 through claim 3.

* * * * *